United States Patent
Choi

(10) Patent No.: US 7,263,563 B2
(45) Date of Patent: Aug. 28, 2007

(54) MULTI-BUS DRIVER APPARATUS AND METHOD FOR DRIVING A PLURALITY OF BUSES

(75) Inventor: Chang-Jun Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 56 days.

(21) Appl. No.: 10/842,522

(22) Filed: May 11, 2004

(65) Prior Publication Data

US 2005/0033868 A1     Feb. 10, 2005

(30) Foreign Application Priority Data

Aug. 8, 2003     (KR)     ............... 10-2003-0055076

(51) Int. Cl.
G06F 3/00 (2006.01)
G06F 7/00 (2006.01)
G11C 8/00 (2006.01)

(52) U.S. Cl. .................. 710/5; 712/300; 365/230.02

(58) Field of Classification Search .............. 710/5; 712/300; 365/230.02
See application file for complete search history.

(56) References Cited

U.S. PATENT DOCUMENTS

| | | | | |
|---|---|---|---|---|
| 4,495,598 A | * | 1/1985 | Vahlstrom et al. ......... | 712/300 |
| 4,999,808 A | * | 3/1991 | Blahut et al. ............... | 712/300 |
| 5,265,237 A | * | 11/1993 | Tobias et al. ............... | 710/65 |
| 5,585,740 A | * | 12/1996 | Tipon .......................... | 326/26 |
| 5,646,558 A | * | 7/1997 | Jamshidi ..................... | 326/106 |
| 5,751,614 A | * | 5/1998 | Cohen ......................... | 708/231 |
| 5,781,457 A | * | 7/1998 | Cohen et al. ............... | 708/231 |
| 5,907,865 A | * | 5/1999 | Moyer ......................... | 711/201 |
| 6,141,716 A | * | 10/2000 | Kwon .......................... | 710/311 |
| 6,311,199 B1 | * | 10/2001 | Tamura et al. .............. | 708/204 |
| 6,347,326 B1 | * | 2/2002 | Jensen et al. ............... | 708/625 |
| 6,351,750 B1 | * | 2/2002 | Duga et al. ................. | 707/102 |
| 6,683,530 B1 | * | 1/2004 | Wang .......................... | 340/146.2 |
| 6,687,262 B1 | * | 2/2004 | Jin et al. ..................... | 370/476 |
| 6,819,141 B1 | * | 11/2004 | Qi et al. ...................... | 326/119 |

FOREIGN PATENT DOCUMENTS

| | | |
|---|---|---|
| JP | 5-28107 A | 2/1993 |
| KR | 0155924 B1 | 7/1998 |

* cited by examiner

Primary Examiner—Glenn A. Auve
Assistant Examiner—Christopher Daley
(74) Attorney, Agent, or Firm—Harness, Dickey & Pierce, P.L.C.

(57) ABSTRACT

A bus driving method and apparatus for driving a plurality of buses including a control logic for generating and outputting control signals and bus selection signals, a byte rotator for dividing data from a data source into a data unit, and changing a sequence of the data unit for outputting data selected by a byte-operation, a sign extender controlled by the control signals for outputting the selected data and converting any non-selected data to a sign value, and a bus selection circuit controlled by the bus selection signals to select a bus among a plurality of buses and to load the selected bus with data outputted from the sign extender.

18 Claims, 5 Drawing Sheets

MULTI-BUS DRIVER APPARATUS AND METHOD FOR DRIVING A PLURALITY OF BUSES

CROSS-REFERENCE TO RELATED APPLICATIONS

This U.S. nonprovisional patent application claims priority under 35 U.S.C. § 119 of Korean Patent Application 2003-55076 filed on Aug. 8, 2003, the entire contents of which are hereby incorporated by reference.

BACKGROUND OF THE INVENTION

1. Field of the Invention

The present invention relates to a method and apparatus for driving a plurality of buses in a high speed microprocessor.

2. Discussion of the Related Art

Performance of microprocessors employing buses with a pipeline structure may require a data by-pass implementation for the buses. The number of by-pass buses may increase as the size of the pipeline becomes greater. When loading the same data for a multiplicity of buses, each bus may request another bus driver in parallel. Accordingly, when a bus driver is requested, corresponding to the number of buses, there may be an increase in the amount of a control signals required to operate the buses.

Some examples of buses with a pipeline structure include e a single-rail bus structure and a dual-rail bus structure. In the single rail bus structure, substantial time may be required for charging and discharging data buses, because of a large swing width between high and low voltage levels. As a result, there is a reduction in the performance of the microprocessors, caused by inducing, in order to increase power consumption. In contrast, the dual-rail bus structure may have a fast response speed with low power, due to a narrow swing width, when compared to the single-rail bus structure.

FIG. 1 is a block diagram showing a bus driver of a conventional 32-bit microprocessor having a triple dual-rail bus structure. Referring to FIG. 1, the conventional bus driver includes a byte rotator 102, a buffer circuit 104 and sign extenders 106, 108 and 110. The byte rotator 102 divides the 32-bit data received from a data source into 4 bytes. The byte rotator 102 changes the position of each byte, according to a byte-operation, to output rotated data (Data_R). The sign extenders 106, 108 and 110 convert the rotated data, not selected by the byte-operation, into a sign value according to the byte-operation. Additionally, the sign extenders 106, 108 and 110 are a part of each individual bus (a first bus, a second bus and a third bus) respectively. As not shown in FIG. 1, the conventional sign extenders 106, 108 and 100 may use NMOS-2 stacks of transistors (N1 and N2 respectively) as a final bus driver.

As shown in FIG. 1, to load data to several buses (the first, second and third buses), it is essential for a conventional bus driver to have sign extenders 106, 108 and 110, including a bus driver, which may be implemented by the NMOS-2 stack at each bus. As a result, the capacity of a gate capacitor of the byte rotator 102 and a metal capacitor is increased.

Integrated and high-performance microprocessors have previously required several buses. As a result, since the number of bus driver circuits are increased, and corresponding buffers are added, the dimension component of the hardware is increased. Therefore, the control logic becomes more complex, and the performance of the microprocessors is reduced.

SUMMARY OF THE INVENTION

Exemplary embodiments of the present invention provide a method and apparatus for driving a plurality of buses.

Exemplary embodiments of the present invention provide a control logic generating and outputting control signals and bus selection signals, a byte rotator dividing data from a data source into byte units, and changing a sequence of the byte units according to a byte-operation, a sign extender controlled by the control signals to output data selected by the byte-operation and convert the non-selected data to a sign value, a bus selection circuit controlled by the bus selection signals to select a bus among a plurality of buses and load the selected bus with data from the sign extender.

Exemplary embodiments of the present invention include the selected data as a single-byte unit, a half-word unit and a word unit.

Exemplary embodiments of the present invention include the byte rotator locating the selected data by locating a least significant byte of the data unit.

Exemplary embodiments of the present invention further include the bus selection circuit having switch devices, where the switch devices are connected between each bus and the sign extender, and are controlled by the bus selection circuit to connect or isolate the buses, and may contain a PMOS transistor.

Exemplary embodiments of the present invention further include the sign extender having a first control circuit controlled by a first selection control signal from the control logic to control an output of the most least significant byte among data selected by the byte-operation from the byte rotator, a second control circuit controlled by a second selection control signal from the control logic to control an output of the second least significant byte among data selected by the byte-operation, a third control circuit controlled by a third selection control signal from the control logic to control an output of the third least significant byte among data selected by the byte-operation, and a signing circuit controlled by sign control signals from the control logic to sign the non-selected data of the byte-operation. The first, second, and third control circuits, and the signing circuit may contain an NMOS transistor connected to a bus.

An exemplary embodiments of the present invention provide the sign circuit signs the non-selected data a value of "0".

An exemplary embodiment of the present invention provides a method for generating control and bus selection signals, dividing data received from a data source into byte units, selecting byte units to be outputted by the control signals and changing the sequence of the byte units according to a byte-operation, and selecting a bus among a plurality of buses by the bus selection signal and loading the selected bus with the selected byte units.

An exemplary embodiment of the present invention provides a sign extender for outputting selected data controlled by control signals from a control logic according to a byte-operation including a first control circuit controlled by a first selection control signal to control the most least significant byte among a plurality of bytes, a second control circuit controlled by a second selection control signal to control the second least significant byte among a plurality of bytes, a third control circuit controlled by a third selection control signal to control the third least significant byte among a plurality of bytes, and at least one signing circuit for signing non-selected data of the byte-operation.

Exemplary embodiments of the present invention provide that the at least one signing circuit signs the non-selected data with a final bit value selected by the byte-operation, or a final bit value of "0".

Exemplary embodiments of the present invention provide the first, second and third control circuits and the signing circuit contain at least one NMOS transistor.

Exemplary embodiments of the present invention provide a second signing circuit, where the first signing circuit is controlled by a first signing signal and the second signing circuit is controlled by a second signing signal.

Exemplary embodiments of the present invention provide a first signing circuit configured to sign a greater portion of data than the second signing circuit.

Exemplary embodiments of the present invention provide a first signing circuit configured to sign data according to a single-byte operation and a second signing circuit configured to sign data according to a half-word operation.

An exemplary embodiments of the present invention provides A bus selection circuit including first and second transistors turned on by a first bus selection signal and loading input data onto a first bus and third and fourth transistors turned on by a second bus selection signal and loading input data onto a second bus, where the data that is not inputted onto at least one of said first and second bus is by-passed onto a third bus.

An exemplary embodiments of the present invention provides a method including receiving a plurality of bus selection signals, by-passing input data onto a first bus, turning on first and second transistors by a first bus selection signal and loading input data onto a second bus, turning on third and fourth transistors by a second bus selection signal and loading input data onto a third bus.

BRIEF DESCRIPTION OF THE DRAWINGS

The above and other examples and exemplary embodiments of the present invention will become more apparent by describing in detail exemplary embodiments thereof with reference to the attached drawings in which.

DETAILED DESCRIPTION OF THE INVENTION

Exemplary embodiments of the present invention will now be described in detail with reference to the accompanying drawings, in which exemplary embodiments of the invention are illustrated.

Figure 1:
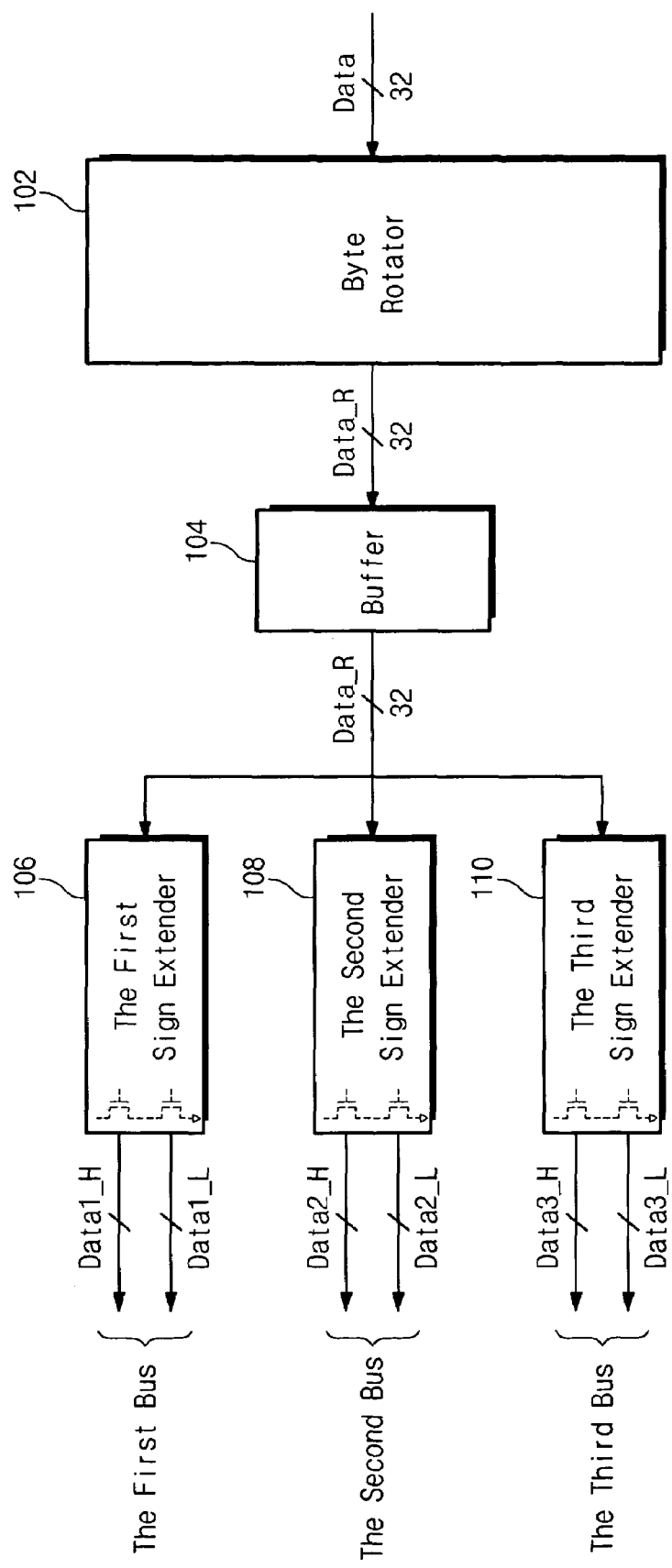
FIG. 1 is a block diagram illustrating a bus driver in a conventional 32 bit microprocessor with a triple dual-rail bus structure according to an exemplary embodiment of the present invention.
Figure 2:
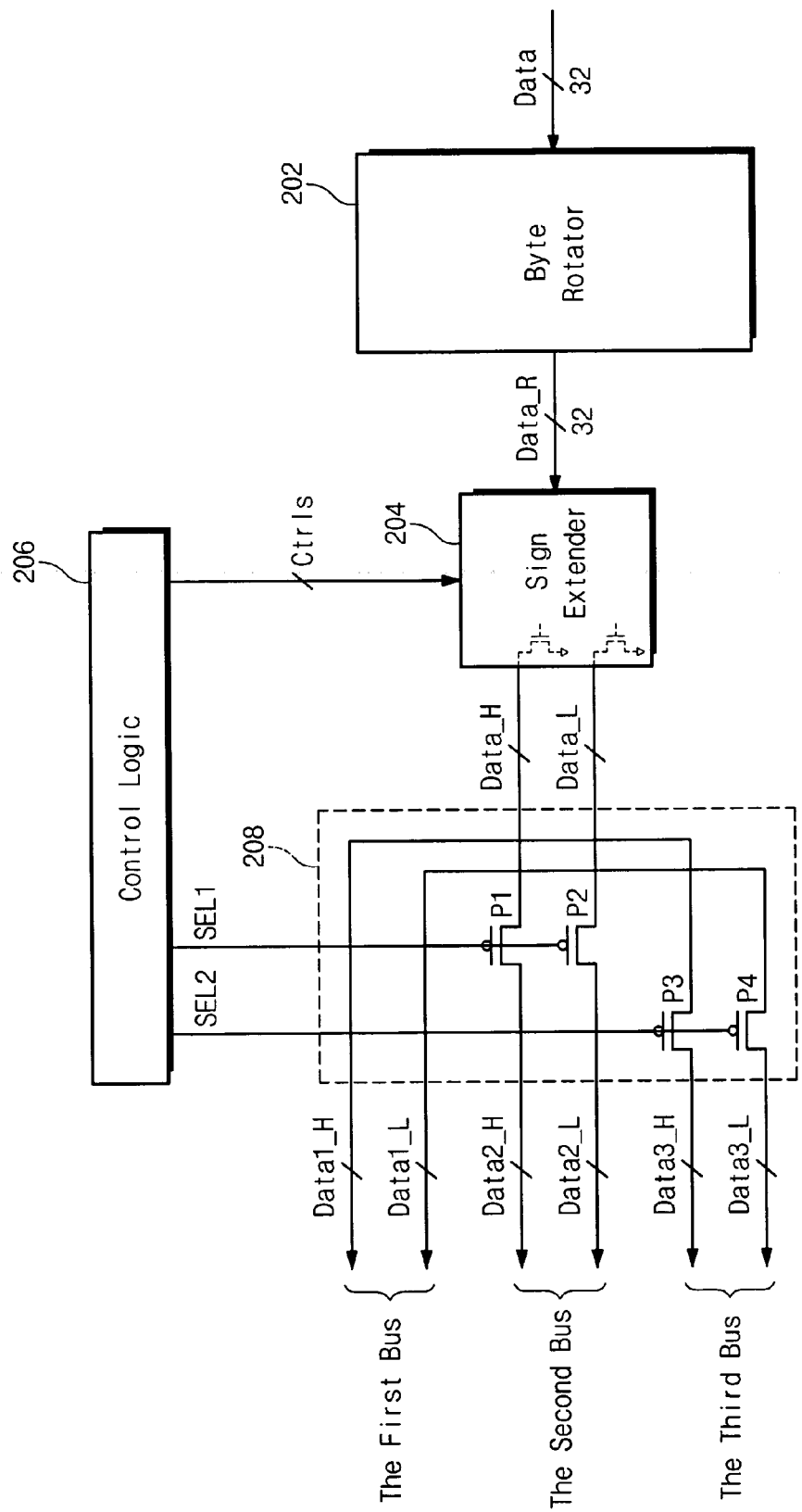
FIG. 2 is a block diagram illustrating an exemplary embodiment of the bus driver for driving a plurality of buses.

FIG. 2, according to an exemplary embodiment of the present invention, is a block diagram of a bus driver for driving a plurality of buses. FIG. 2, illustrates a bus driver, which includes a control logic 206, a byte rotator 202, a sign extender 204 and a bus selection circuit 208.

The control logic 206 generates control signals (Ctrls) and bus selection signals (SEL1 and SEL2) and applies them to the sign extender 204, and the bus selection circuit 208. The control signals control the operation of the sign extender 204, and the bus selection signals control the operation of the bus selection circuits 208. The byte rotator 202 divides the 32-bit data received from a data source into 4 bytes of 8 bits, and converts the position of the divided data into byte units in preparation for output.

Figure 3:
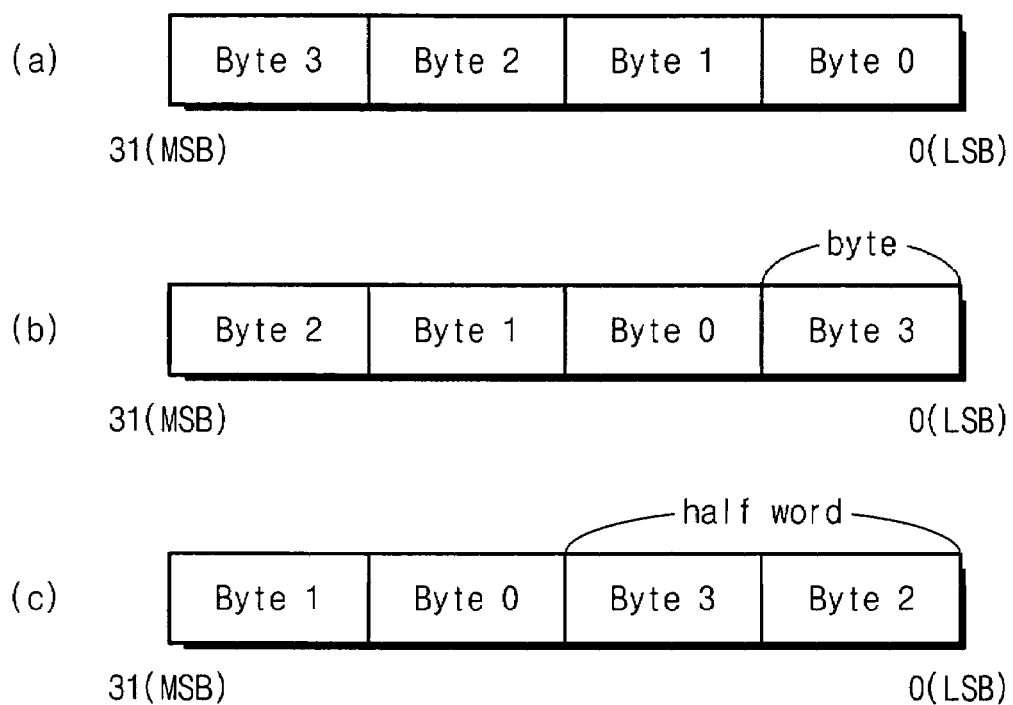
FIG. 3 illustrates a change of position of a byte according to a byte-operation of a byte rotator of FIG. 2, and in accordance with an exemplary embodiment of the present invention.

FIG. 3 shows the operation of a byte rotator of a byte-operation, according to an exemplary embodiment of FIG. 2. The byte-operation, may load a bus with a single byte unit (8 bits), a half-word unit (16 bits) or a word unit (32 bits) or not. For example, if the byte-operation is using the single byte unit required for outputting byte 3 of the data, shown in (a) of FIG. 3, it is necessary for the position of byte 3, shown in (b) of FIG. 3 to be converted to a least significant byte position before being provided to the bus. In addition, if byte 2 and byte 3 are requested in a half-word unit, as shown in (c) of FIG. 3, it is necessary for byte 2 and byte 3 to be transferred to lesser significant byte positions before being provided to the bus.

The sign extender 204, of FIG. 2, is controlled by the control signals of the control logic according to the byte-operation. As a result, the sign extender 204 will output the data of the selected byte among the rotated data (Data_R) provided by the byte rotator 202. The non-selected data, among the data not included in the selected bytes of the byte-operation, is converted into a sign value, and provided to the bus.

Figure 4:
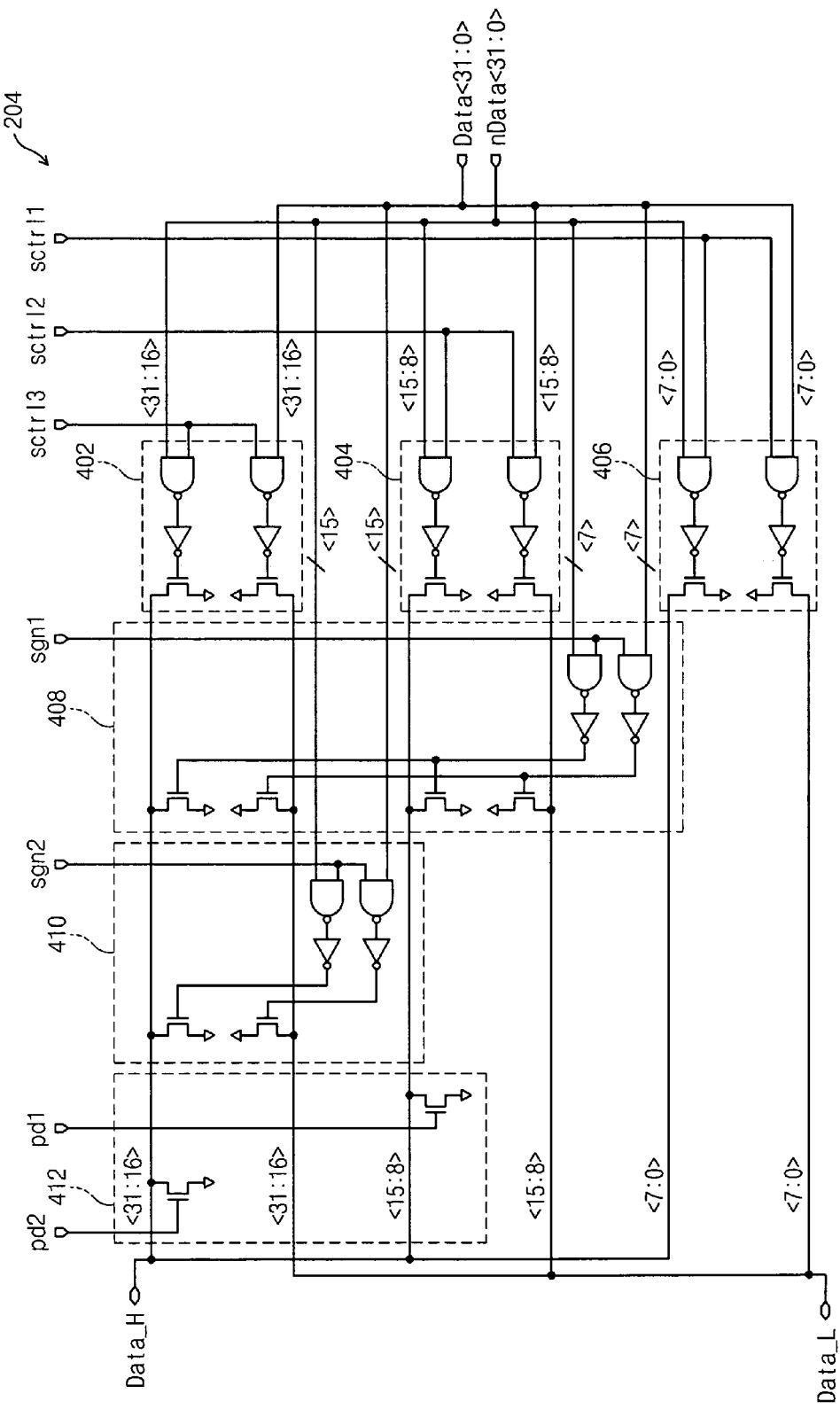
FIG. 4 is a circuit diagram illustration of a sign extender, of FIG. 2, and in accordance with an exemplary embodiment of the present invention.

FIG. 4 is a circuit diagram illustrating an exemplary embodiment of the sign extender used by the bus driver. As illustrated in FIG. 4, the sign extender of the present invention includes, a first control circuit 406, a second control circuit 404, and a third control circuit 402. The first control circuit 406 is controlled by a first selection control signal (sctrl1) from the control logic 206, to control output data (Data<7:0> and nData<7:0>) of the most least significant byte of a byte operation. The second control circuit 404 is controlled by a second control signal (sctrl2) to control output data (Data<15:8> and nData<15:8>) of the second least significant byte of a byte operation. The third control circuit 402 is controlled by a third control signal (sctrl3) to control output data (Data<31:16> and nData<31:16>) of the third least and fourth least significant bytes, or a half-word of a half-word operation. Additionally, each control circuit 402, 404 and 406 may contain a NAND gate and a NMOS transistor.

Furthermore, the sign extender 204 includes signing circuits 408 and 410. The signing circuits 408 and 410 convert the non-selected data remaining from the output data not selected by the byte-operation into a sign value before providing the signed data to the bus. The signing of data is classified into two different procedures, first, data may be signed employing a final bit value of data selected by the byte-operation, and second all data may be signed to a value of "0".

In an exemplary embodiment of FIG. 4, the sign extender 204 includes a first sign circuit 408 and a second signing circuit 410. The first sign circuit 408 is controlled by a first sign signal (sgn1) to sign data (Data<8:31> and nData<8:31>) except for the least significant data (Data<7:0> and nData<7:0>) depending on the 8$^{th}$ bit value of the least significant data (Data<7> and nData<7>) in the byte-operation. The second sign circuit 410 is controlled by a second sign signal (sgn2) to sign data (Data<16:31> and nData<16:31>) except for the second least significant data (Data<15:0> and nData<15:0>) depending on the 16$^{th}$ bit value (Data<15> and nData<15>) in the half-word operation. The sign extender 204, of FIG. 4 in accordance with an exemplary embodiment of the present invention, includes a pull-down driver 412 implemented by a NMOS transistor. The pull-down driver 412 is controlled by pull-down signals (pd1 and pd2) from the control logic. The pull-down signals will discharge a bus line of non-selected data, thereby making the non-selected data zero. The pull-down driver 412 may output the non-selected data, by making the data zero, based on an enable signal of the pull-down signals, and in accordance with a byte-operation. For a half-word operation, the pull-down driver 412 may convert a majority of the remaining non-selected data to zero, based on the enable of the pd2 signal.

Referring to FIG. 2, in accordance with an exemplary embodiment of the present invention, the bus selection circuit 208 is controlled by the bus selection signals (SEL1) and (SEL2) to select a bus for data output. The bus selection circuit 208 loads input data from the sign extender 204 to the selected bus. In FIG. 2, the bus selection circuit 208 includes switch devices connected to each bus line. As illustrated in FIG. 2, and in accordance with an exemplary embodiment of the present invention, PMOS transistors P1, P2, P3 and P4 are used with the switch device. The bus selection circuit 208 is configured to provide the data buses with the data inputted from the sign extender 204. The bus selection circuit may provide a data by-pass operation, loading data from the sign extender 204, directly to a first bus. The bus selection circuit may turn on first and second PMOS transistors P1 and P2, through the enable of the first selection signal (SEL1), thereby loading data to a second bus. In addition, the bus selection circuit may turn on third and fourth PMOS transistors P3 and P4, through the enable of the second selection signal (SEL2), thereby loading data to a third bus.

As previously mentioned, a conventional pre-charge bus may perform a final bus driving operation using a NMOS-2 transistor stack. However, as shown in FIGS. 2 and 4, and in accordance with an exemplary embodiment of the present invention, a final bus driving operation, implementing PMOS (P1, P2, P3 and P4) transistors in the bus selection circuit 208, as well as an NMOS transistor in the sign extender 204, may improve the driving speed of a bus. If buses are driven using a conventional NMOS-2 stack, before the voltage of a source is evaluated as less than a threshold voltage, the buses may not be driven by the total voltage that is applied between a gate and a source of the NMOS transistor. However, if the bus is driven by PMOS and NMOS transistors, data processing decisions may occur at a faster speed, by reflecting the difference between a source and a drain, and disregarding source voltage. As a result, it is possible to improve total bus driving speed.

Figure 5A:
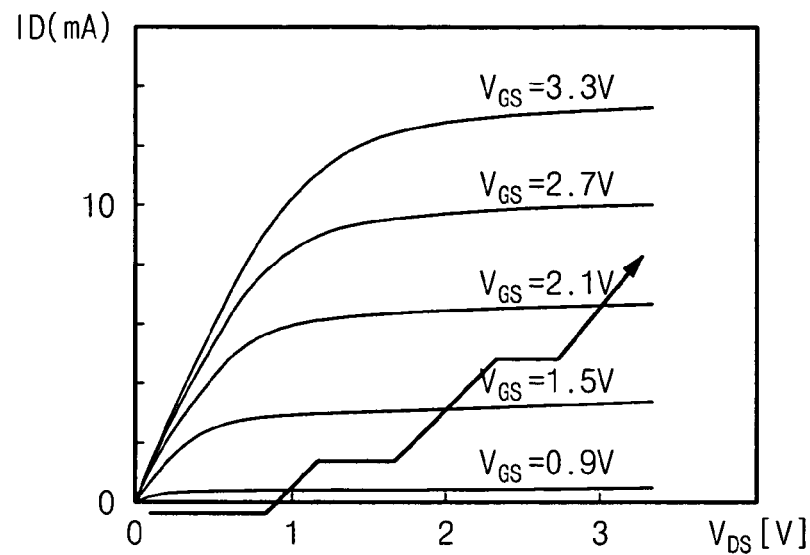
FIG. 5A is a characteristic curve illustrating operation characteristics of an NMOS transistor in accordance with exemplary embodiments of the present invention.
Figure 5B:
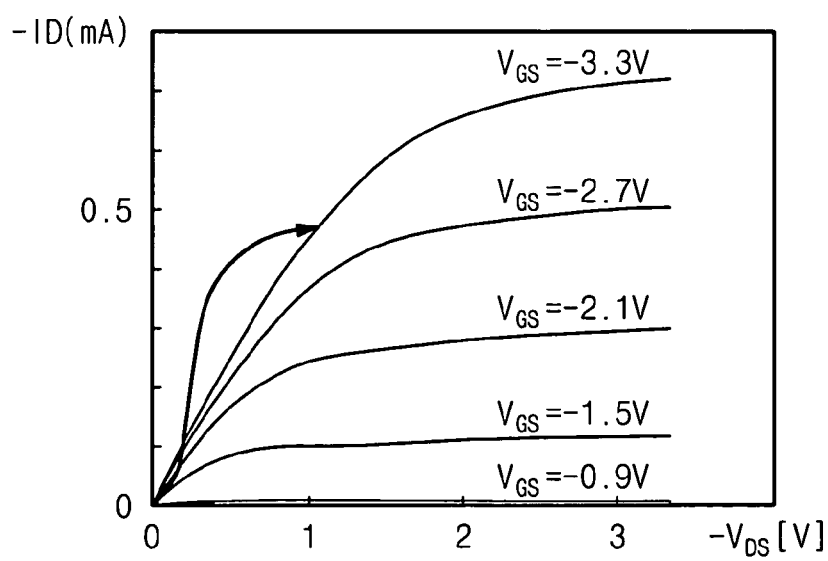
FIG. 5B is a characteristic curve illustrating operation characteristics of a PMOS transistor in accordance with exemplary embodiments of the present invention.

FIGS. 5A and 5B represent characteristic curves illustrating the operational characteristics of the NMOS and the PMOS transistors, respectively, and in accordance with exemplary embodiments of the present invention. As illustrated in FIGS. 5A and 5B, an initial reaction speed of the NMOS and PMOS transistors, when applying a source, indicates that a PMOS transistor has a faster reaction speed than an NMOS transistor.

As previously mentioned, in exemplary embodiments of the present invention, the bus driver of the present invention may drives a plurality of buses by a sign extender, which employs a bus selection circuit, so that dimension efficiency may be improved. Furthermore, buses are driven by employing a pair of PMOS and NMOS transistors. As a result, buses can be driven at a fast speed.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A bus driver for driving a plurality of buses comprising:
    a control logic generating and outputting control signals and bus selection signals;
    a byte rotator dividing data from a data source into byte units, and changing a sequence of the byte units according to a byte-operation;
    a sign extender receiving control signals and to output data selected by the byte-operation of the byte rotator and convert the non-selected data to a sign value; and
    a bus selection circuit controlled by the bus selection signals to select a bus among a plurality of buses and load the selected bus with data from the sign extender.

2. The bus driver for driving a plurality of buses of claim 1, wherein the selected data is at least one of a single-byte unit, a half-word unit and a word unit.

3. The bus driver for driving a plurality of buses of claim 1, wherein the byte locates a least significant byte of the data unit when changing the sequence of the byte units.

4. The bus driver for driving a plurality of buses of claim 1, wherein the bus selection circuit contains switch devices connected between each of the plurality of buses and the sign extender, and are controlled by the bus selection circuit to connect or isolate the buses.

5. The bus driver for driving a plurality of buses of claim 4, wherein the switch devices contain a PMOS transistor.

6. The bus driver for driving a plurality of buses of claim 1, wherein the sign extender comprises:
    a first control circuit controlled by a first selection control signal from the control logic, to control an output of the most least significant byte among data selected by the byte-operation;
    a second control circuit controlled by a second selection control signal from the control logic, to control an output of the second least significant byte among data selected by the byte-operation;
    a third control circuit controlled by a third selection control signal from the control logic, to control an output of the third least significant byte among data selected by the byte-operation; and
    a signing circuit controlled by sign control signals from the control logic to sign the non-selected data of the byte-operation.

7. The bus driver for driving a plurality of buses of claim 6, wherein the first control circuit, the second control circuit, the third control circuit and the signing circuit include an NMOS transistor connected to a bus.

8. The bus driver for driving a plurality of buses of claim 6, wherein the sign circuit signs the non-selected data a value of "0".

9. A method comprising:
    generating control signals and bus selection signals;
    dividing data received from a data source into byte units;

receiving control signals, selecting byte units and changing the sequence of the byte units according to a byte-operation; and selecting a bus among a plurality of buses and loading the selected bus with the selected byte units, in accordance with the bus selection signals.

10. A sign extender adapted for use in a bus driving device, said sign extender receiving control signals from a control logic and outputting selected data according to a byte-operation of a byte rotator comprising:

a first control circuit controlled by a first selection control signal to control a least significant byte among a plurality of bytes;

a second control circuit controlled by a second selection control signal to control a second least significant byte among the plurality of bytes;

a third control circuit controlled by a third selection control signal to control a third least significant byte among the plurality of bytes; and at least one signing circuit for signing non-selected data of the byte-operation.

11. A sign extender of claim 10, wherein the at least one signing circuit signs the non-selected data with a final bit value selected by the byte-operation.

12. A sign extender of claim 10, wherein the at least one signing circuit signs the non-selected data with a final bit value of "0".

13. A sign extender of claim 10, wherein the first, second and third control circuits and the signing circuit contain at least one NMOS transistor.

14. A sign extender of claim 10, further comprising:

a second signing circuit, where the first signing circuit is controlled by a first signing signal and the second signing circuit is controlled by a second signing signal.

15. A sign extender of claim 14, wherein the first signing circuit is configured to sign a greater portion of data than the second signing circuit.

16. A sign extender of claim 14, wherein the first signing circuit is configured to sign data according to a single-byte operation and the second signing circuit is configured to sign data according to a half-word operation.

17. A sign extender adapted for use in a bus driving device, said sign extender receiving control signals from a control logic and outputting selected data according to a byte-operation of a byte rotator comprising:

a plurality of control circuits, wherein each control circuit is controlled by a selection control signal to control a position of a byte among a plurality of bytes; and at least one signing circuit for signing non-selected data of the byte-operation.

18. A sign extender according to claim 17, wherein a significance is associated with the position of the byte relative to the plurality of bytes.

* * * * *